(12) United States Patent
Kossel (10) Patent No.: US 10,943,653 B2
(45) Date of Patent: Mar. 9, 2021

(54) MEMORY RECEIVER WITH RESISTIVE VOLTAGE DIVIDER

(71) Applicant: International Business Machines Corporation, Armonk, NY (US)

(72) Inventor: Marcel A. Kossel, Reichenburg (CH)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 16/108,207

(22) Filed: Aug. 22, 2018

(65) Prior Publication Data

US 2020/0067457 A1 Feb. 27, 2020

(51) Int. Cl.
| | |
|---|---|
| *G11C 13/00* | (2006.01) |
| *H03F 1/02* | (2006.01) |
| *H03F 3/45* | (2006.01) |
| *G05F 3/08* | (2006.01) |
| *G11C 7/10* | (2006.01) |
| *G06F 3/06* | (2006.01) |

(Continued)

(52) U.S. Cl.
CPC ........... *G11C 13/004* (2013.01); *G05F 3/08* (2013.01); *G06F 3/0604* (2013.01); *G06F 3/0659* (2013.01); *G06F 3/0673* (2013.01); *G06F 13/1668* (2013.01); *G11C 7/1048* (2013.01); *H03F 1/0211* (2013.01); *H03F 3/45076* (2013.01); *H03F 2203/45544* (2013.01); *H03F 2203/45598* (2013.01); *H03M 1/12* (2013.01)

(58) Field of Classification Search
CPC ............ H03F 1/0211; H03F 3/45076; H03F 2203/45544; H03F 2203/45598; H03F 2203/45581; H03F 2203/45591; H03F 3/45183; G05F 3/08; G11C 7/1048; G11C 7/1084; G06F 3/0604; G06F 3/0673; G06F 13/1668; G06F 3/0659; H03M 1/12
See application file for complete search history.

(56) References Cited

U.S. PATENT DOCUMENTS 9,143,369 B2 9/2015 He et al.
9,184,712 B2 11/2015 Song
(Continued)

FOREIGN PATENT DOCUMENTS

WO WO-2014018063 A1 * 1/2014 ............ G11C 7/062

OTHER PUBLICATIONS

Kossel, Marcel, et al., "DDR4 Transmitter with AC-Boost Equalization and Wide-band Voltage Regulators for Thin-oxide Protection in 14-nm SOI CMOS Technology", IEEE 2017, pp. 115-118.
(Continued)

*Primary Examiner* — Ajay Ojha
(74) *Attorney, Agent, or Firm* — Harrington & Smith (57) ABSTRACT

A receiver circuit is configured to receive input signals having a first reference voltage level. The first reference voltage level is a first logical high voltage level. The receiver circuit comprises an input stage comprising a resistive voltage divider. The resistive voltage divider is configured to convert the input signals having the first reference voltage level to input signals having a second reference voltage level. The second reference voltage level is a second logical high voltage level. The receiver circuit comprises a preamplifier configured to receive and amplify the input signals having the second reference voltage level.

23 Claims, 6 Drawing Sheets

(51) Int. Cl.
G06F 13/16 (2006.01)
H03M 1/12 (2006.01)

(56) References Cited

U.S. PATENT DOCUMENTS 9,571,311 B2 2/2017 Amirkhany et al.
2019/0392886 A1* 12/2019 Cox ..................... G11C 7/225

OTHER PUBLICATIONS

Starke, W.J., et al., "the cache and memory subsystems of the IBM POWER8 processor", IBM J. Res. & Dev., vol. 59, No. 1, Paper 3, Jan./Feb. 2015, 13 pgs.

* cited by examiner

MEMORY RECEIVER WITH RESISTIVE VOLTAGE DIVIDER

BACKGROUND OF THE INVENTION

The present invention relates to a receiver circuit, and further relates to a corresponding memory system comprising the receiver circuit and a corresponding design structure.

Double data rate (DDR) memory links use burst-mode signaling, which means that data is transmitted in bursts of several bytes and in between these transmission bursts the transmitter is either in termination mode for the reception of data from the DRAM or in idle mode, the latter providing a high impedance state.

Receivers of such memory links often comprise thin oxide transistors. Such thin oxide transistors may face a gate-oxide breakdown if the gate voltage exceeds a maximum threshold voltage Vmax. Hence there is a need for advantageous receiver architectures, in particular receiver architectures with efficient power consumption that avoid Vmax violations.

BRIEF SUMMARY OF THE INVENTION

According to a first aspect, the present invention is embodied as a receiver circuit configured to receive input signals having a first reference voltage level. The first reference voltage level is a first logical high voltage level. The receiver circuit comprises an input stage comprising a resistive voltage divider. The resistive voltage divider is configured to convert the input signals having the first reference voltage level to input signals having a second reference voltage level. The second reference voltage level is a second logical high voltage level. The receiver circuit comprises a preamplifier configured to receive and amplify the input signals having the second reference voltage level.

According to another aspect, the invention is embodied as a memory system. The memory system, comprises a memory controller, a memory module, and a memory bus arranged between the memory controller and the memory module. The memory controller comprises a receiver circuit configured to receive input signals having a first reference voltage level. The first reference voltage level is a first logical high voltage level of the memory module. The receiver circuit comprises an input stage comprising a resistive voltage divider. The resistive voltage divider is configured to convert the input signals having the first reference voltage level to input signals having a second reference voltage level. The second reference voltage level is a second logical high voltage level. In addition, the receiver circuit comprises a preamplifier configured to receive and amplify the input signals having the second reference voltage level.

According to yet another aspect, the invention can be embodied as a design structure tangibly embodied in a machine readable medium for designing, manufacturing, or testing an integrated circuit. The design structure comprises a receiver circuit configured to receive input signals having a first reference voltage level. The first reference voltage level is a first logical high voltage level. The receiver circuit comprises an input stage comprising a resistive voltage divider. The resistive voltage divider is configured to convert the input signals having the first reference voltage level to input signals having a second reference voltage level. The second reference voltage level is a second logical high voltage level. In addition, the receiver circuit comprises a preamplifier configured to receive and amplify the input signals having the second reference voltage level.

Devices and methods embodying the present invention will now be described, by way of non-limiting examples, and in reference to the accompanying drawings. Technical features depicted in the drawings are not necessarily to scale. Also some parts may be depicted as being not in contact to ease the understanding of the drawings, whereas they may very well be meant to be in contact, in operation.

DETAILED DESCRIPTION OF THE INVENTION

Figure 1:
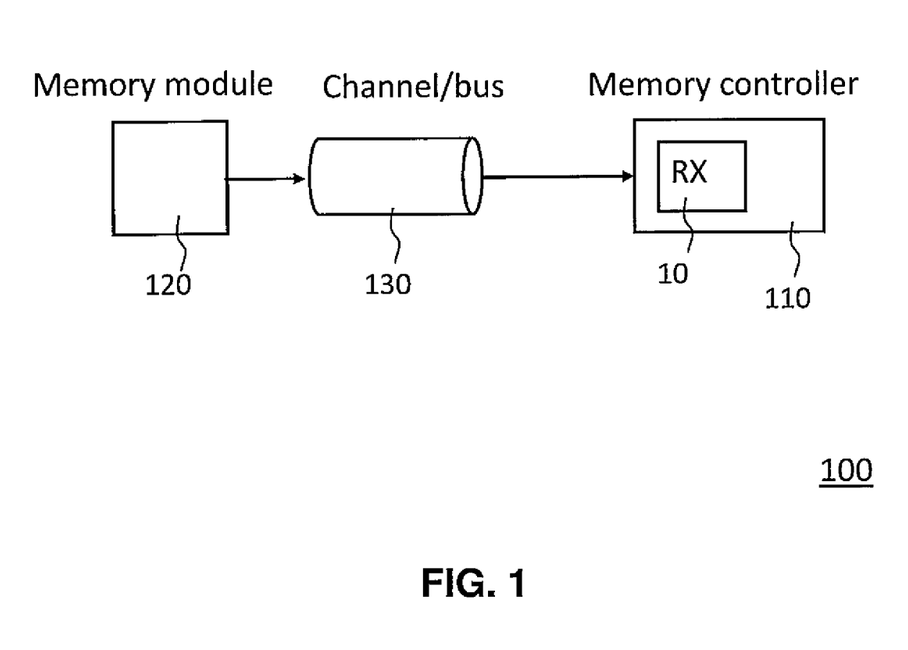
FIG. 1 shows a schematic block diagram of a memory system according to an embodiment of the invention.

FIG. 1 shows a schematic block diagram of a memory system 100 according to an embodiment of the invention. The memory system 100 comprises a memory controller 110, a memory module 120, and a memory bus 130, which may also be denoted as memory channel, arranged between the memory controller 110 and the memory module 120. The memory controller 110 comprises a receiver circuit (RX) 10. The memory module 120 may be in particular a double data rate (DDR) memory module and in particular a DDR memory module according to the Joint Electron Device Engineering Council (JEDEC) DDR-4 or DDR-5 standard. The Joint Electron Device Engineering Council is now also denoted as the Solid State Technology Association.

Figure 2:
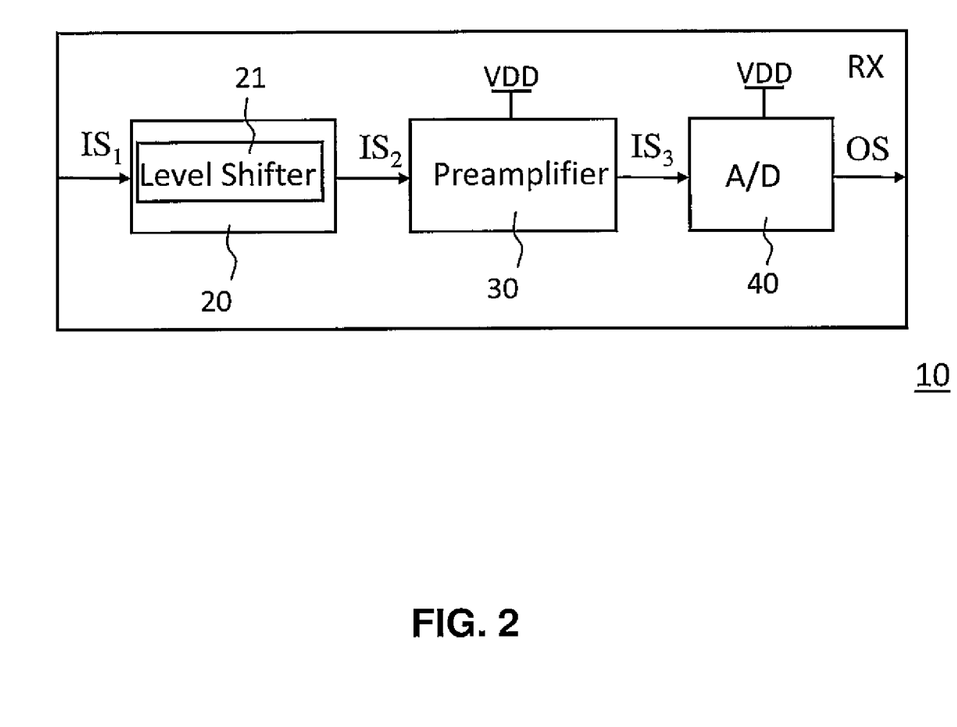
FIG. 2 shows an exemplary block diagram of a receiver circuit according to an embodiment of the invention.

FIG. 2 shows an exemplary block diagram of a receiver circuit 10 according to an embodiment of the invention. The receiver circuit 10 comprises an input stage 20 comprising a resistive voltage divider 21, a preamplifier 30 (which may be a transconductance amplifier), and an analog-to-digital (A/D) converter 40.

The resistive voltage divider 21 may also be denoted as level shifter 21. The resistive voltage divider 21 receives input signals $IS_1$ having a first reference voltage level. The first reference voltage level is a first logical high voltage level. In other words, it is the voltage level that represents a logical 1 level of the input signal IS'. According to embodiments, the input signal $IS_1$ is a read out signal of a double data rate (DDR) memory module. Such DDR memory modules operate with different supply voltages VDDR in dependence on the respective standard. As an example, the supply voltage of DDR3 is 1.5 V or 1.35 V for the low power version DDR3L. The supply voltage of DDR4 is 1.2 V or 1.05 V for the low power version DDR4L.

The resistive voltage divider 21 converts the input signals $IS_1$ of the first reference voltage level to input signals $IS_2$ of a second reference voltage level. The second reference voltage level is a second logical high voltage level. According to embodiments, the second reference voltage level is equal to a logic voltage level VDD of logic of a memory controller, e.g. a voltage level of 900 mV. The preamplifier 30 provides pre-amplified analog input signals IS3 to the A/D converter 40 and the A/D converter 40 provides digital output signals OS.

The preamplifier 30 and the A/D converter 40 operate with the logic voltage level VDD as supply voltage.

Hence, the preamplifier 30 and the A/D converter 40 are capable of receiving VDDR-referred signals without actually drawing current from the VDDR voltage. Hence there is no local VDDR current consumption in the receiver circuit 10 because the level conversion from VDDR to VDD is implicitly performed by the resistive voltage divider 21 in which the reference and input signals are the same as opposed to a level-converting active front-end that needs to be operated from the VDDR-supply, which is typically higher than the VDD-supply used for regular logic. As a consequence of the elimination of a local VDDR-current consumption, the receiver 10 can be operated at low power from the VDD-supply only. In addition, the receiving circuitries are inherently protected against overvoltages if VDDR is higher than the maximum reliability voltage VMAX of the process technology.

Figure 3:
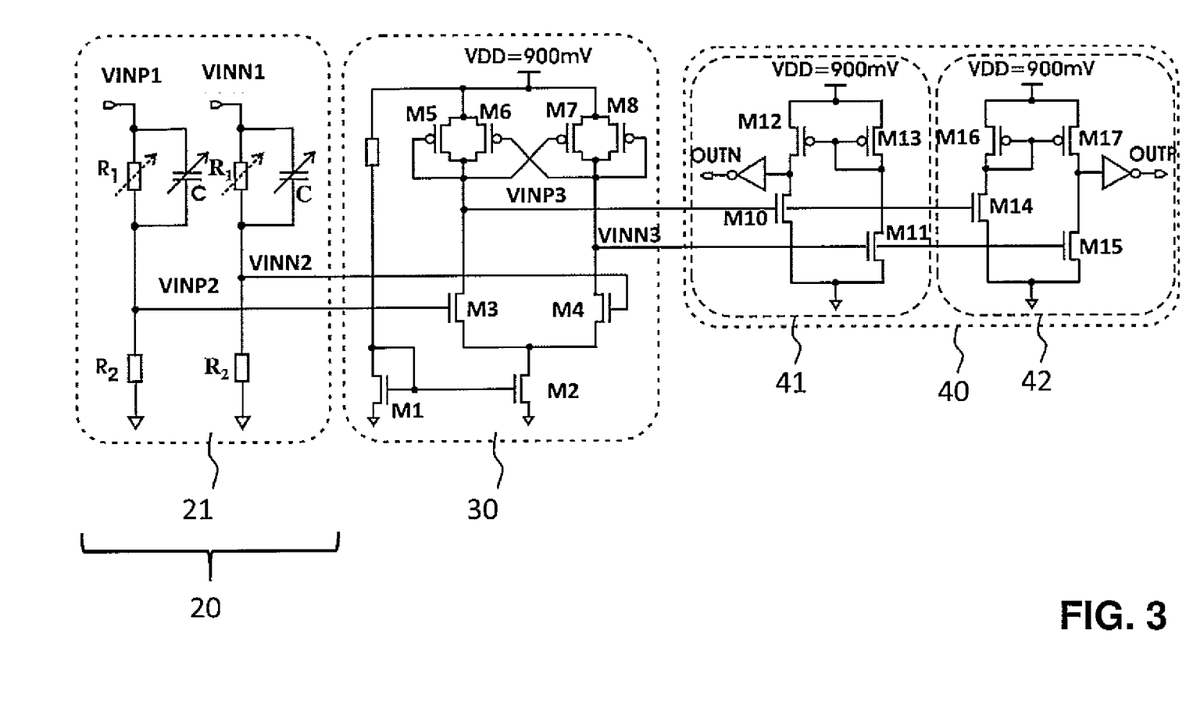
FIG. 3 shows a circuit diagram of a of a receiver circuit according to an embodiment of the invention.

FIG. 3 shows a more detailed embodiment of a circuit implementation of the receiving circuit 10 of FIG. 2.

The input stage 20 with the resistive voltage divider 21 comprises a pair of first resistors $R_1$ and a pair of second resistors $R_2$. The first resistors $R_1$ are embodied as tunable resistors to address the different VDDR-supply ranges defined in the JEDEC DDR standards. The resistive voltage divider 21 further comprises a pair of tunable capacitors C which are arranged in parallel to the first resistors $R_1$. The tunable capacitors C perform an alternating current (AC)-boosting as will be explained in more detail below.

The input stage 20 receives as input signals a differential pair of input voltages VINP1, VINN1 which have the first reference voltage level. The input stage 20 converts the pair of input voltages VINP1, VINN1 to a level shifted differential pair of input voltages VINP2, VINN2 of the lower second reference voltage level. By tuning the resistance of the first pair of resistors $R_1$, a plurality of first reference voltage levels can be flexibly adapted to a fixed second reference voltage level.

According to embodiments, the tunable pair of resistors $R_1$ adapts a logical 1 voltage level VDDR of the respective DDR memory module to the logical-supply level VDD of the corresponding memory controller, while the supply voltage VDDR of the memory module may change within a range of e.g. {1.0 to 1.5V}. As an example, with $R_2$=16kΩ and VDDR=1.2V, $R_1$ is tuned to 5.34kΩ for the logical supply-level VDD=900 mV. Correspondingly, for VDDR=1.0V, $R_1$ can be tuned to 1.781kΩ for the same logical 1 level at VDD=900 mV.

However, such high resistance values of $R_1$ and $R_2$ decrease the pole at the input and hence limit the bandwidth. To compensate for the resulting bandwidth-decrease, the tunable capacitor C is introduced in parallel to $R_1$, which serves as AC-boost capacitor and accelerates the bit edge transitions by providing an additional zero in the transfer characteristic of the receiver circuit 10.

The preamplifier 30 is embodied as gain-boosting amplifier. It comprises a current mirror comprising a transistor M1 and a current source formed by a transistor M2. A differential transistor pair M3, M4 receives the differential input signals of the preamplifier 30. The load of the differential pair comprises one pair of diode-connected (M5, M8) and one pair of cross-coupled (M6, M7) transistors that provide the gain-boosting owing to the negative resistance of the cross-coupled pair. Maximal gain boosting is achieved if the width ratio between the diode-connected and cross-coupled pairs is 1:1. The preamplifier 30 provides pre-amplified input signals VINP3/VINN3 to the A/D converter 40.

While according to the embodiment as described above the input signal VINN1, VINP1 is a differential input signal, corresponding receiver circuit embodiments of the invention may be envisaged that operate with single-ended signals. In particular one input (e.g., VINP1) may receive the incoming signal whereas the other input (e.g., VINN1) receives a constant reference voltage to which the input signal is compared to in the successive stages 30 and 40. Depending on the reference voltage generation the level-conversion can be omitted and the reference voltage can be applied directly to the input of the preamplifier (e.g., at VINN2).

The A/D converter 40 is embodied as full swing converter or limiting amplifier and acts as comparator for the incoming signals. It is configured to convert the pre-amplified input signals VINP3/VINN3 provided at the output of the preamplifier 30 into digital output signals OUTN and OUTP. The A/D converter 40 is operated also at the second reference voltage level, i.e. at the same voltage level VDD as the preamplifier 30, in this example at VDD=900 mV.

The A/D converter 40 comprises a left branch 41 comprising transistors M10, M11, M12, and M13 and a right branch 42 comprising transistors M14, M15, M16, and M17.

The two branches 41, 42 compare the pre-amplified input signals VINP3/VINN3 and provide either an output signal OUTP representing a digital "1" if VINP3 is higher than VINN3 or an output signal OUTN representing a digital "0" if VINP3 is smaller than VINN3.

By providing the tunable capacitors C in parallel to the first resistors $R_1$, the following bandpass characteristic can be obtained to perform an AC-boost equalization:

$$V_{IN2} = \frac{R_2(R_1 + sC)}{R_1 R_2 + sC(R_1 + R_2)} V_{IN1};$$

AC-boost provides spectral shaping or equalization by accelerating the signal edges. As a consequence, the receiver's internal intersymbol-interference (ISI) gets reduced and the signal integrity improves since the inner data eye becomes bigger and reduces the requirements for the successive amplification stages.

For instance for 3200 Mb/s and $R_2$=16kΩ, the input capacitance provided by the differential pair of the negative-$g_m$ gain boosted preamplifier 30 may not exceed C=1/$(2\pi R_2 f)$=6.36 fF if the attenuation of the fundamental frequency should not exceed 3 dB.

The receiver circuit 10 is not operated with the first reference voltage level (VDDR) although it receives input signals having the first reference voltage level. More particularly, the receiver circuit 10 has no power supply connection to the first reference voltage level VDDR. This provides the advantage of power saving and mitigates possible $V_{MAX}$ violations. Furthermore, AC-boost equalization capabilities are included in the receiver circuit 10 by means of the AC-boosted resistive voltage divider 21.

Hence the receiver circuit 10 is capable of receiving VDDR-referred signals without actually drawing current from VDDR and hence there is no VDDR current consumption in the receiver circuit 10. The resistors R1 and R2 are chosen such that a logical 1 level, which is equal to VDDR in DDR4 and DDR5, is converted to VDD, i.e. the power supply of the associated logic so that the successive negative-gm gain boosting stage of the preamplifier 30 does never see input signals higher than VDD.

Another advantageous aspect of the AC-boosted resistive voltage divider 21 according to FIG. 3 is that the impedance level of the resistive voltage divider 21 can be chosen high to save power on the side of the memory module. Furthermore, it may decrease the loading of the on-die termination (ODT) that is provided by a corresponding transmitter of the memory controller, which belongs to the same data lane (in DDR-terminology: DQ lane). The pertinent configuration of the transmitter and receiver for READ-operations across a 2-DIMM per-channel link is illustrated in FIG. 4 and will be explained below in more detail.

Figure 4:
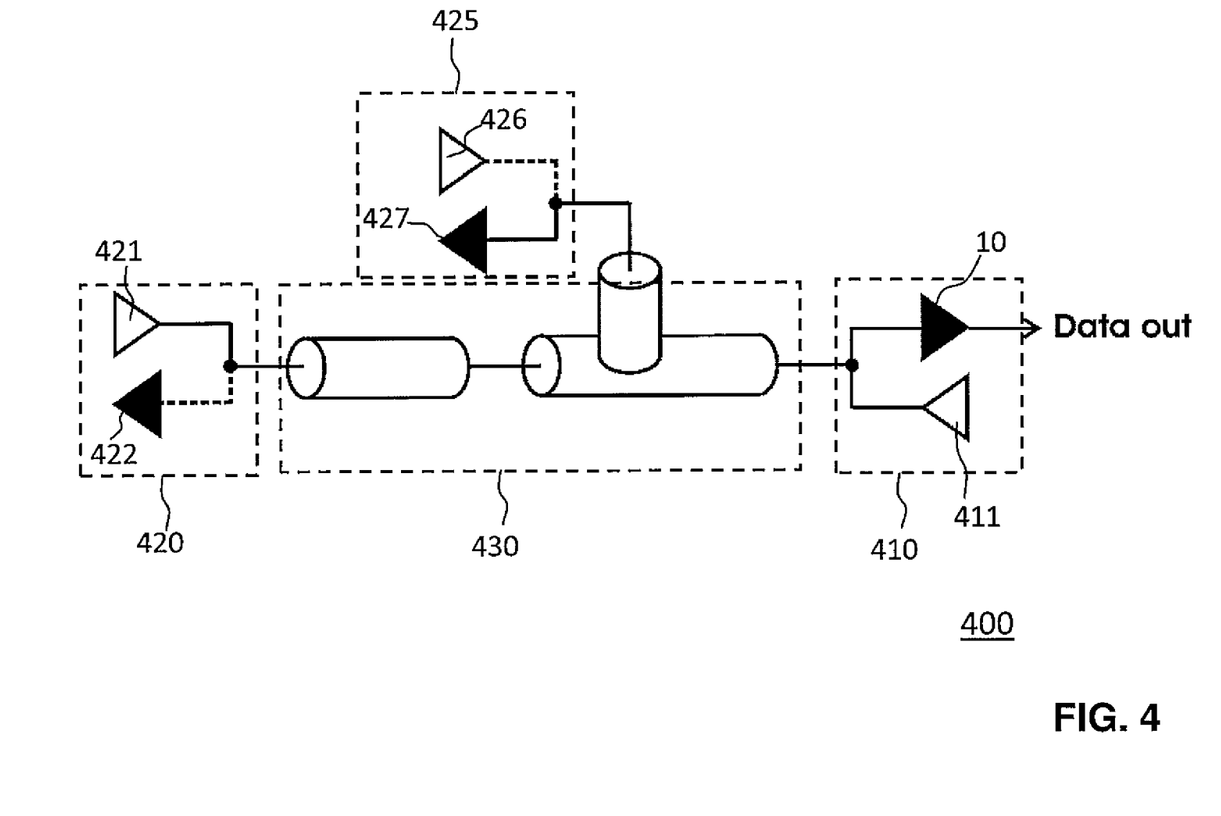
FIG. 4 shows a more detailed embodiment of a memory system according to an embodiment of the invention.

FIG. 4 shows a more detailed embodiment of a memory system 400 according to an embodiment of the invention. The memory system 400 comprises a memory controller 410, a memory module 420, a memory module 425, and a memory channel 430 between the memory module 420, the memory module 425, and the memory controller 410. The memory module 420 and the memory module 425 are embodied as Dual Inline Memory Modules (DIMM). The memory module 420 is a far-end DIMM and the memory module 425 a near-end DIMM. The memory channel 430 is embodied as 2-DIMM 2-rank memory channel.

The memory controller 410 comprises a receiver circuit 10 and a transmitter circuit 411. The memory controller 410 is operated in a READ mode in FIG. 4. The transmitter circuit 411 is operated in an on-die termination (ODT) mode and provides the on-die termination for the receiver circuit 10 belonging to the same bidirectional DQ lane. As an example the transmitter 411 in ODT mode provides a 60Ω pullup impedance for a particular memory channel configuration (e.g., 2-dimm 2-rank channel).

The memory module 420 comprises a transmitter circuit 421 and a receiver circuit 422. Likewise, the memory module 425 comprises a transmitter circuit 426 and a receiver circuit 427. The memory module 420 is operated in a transmit mode and drives the memory channel 430 with 34Ω. The memory module 425 is operated in a termination mode and provides an impedance of 120Ω (pullup). The bidirectional data transmission of DQ memory channels is performed in half-duplex mode. The terms 'transmitting' and 'receiving' are used here from the perspective of the memory controller.

Figure 5:
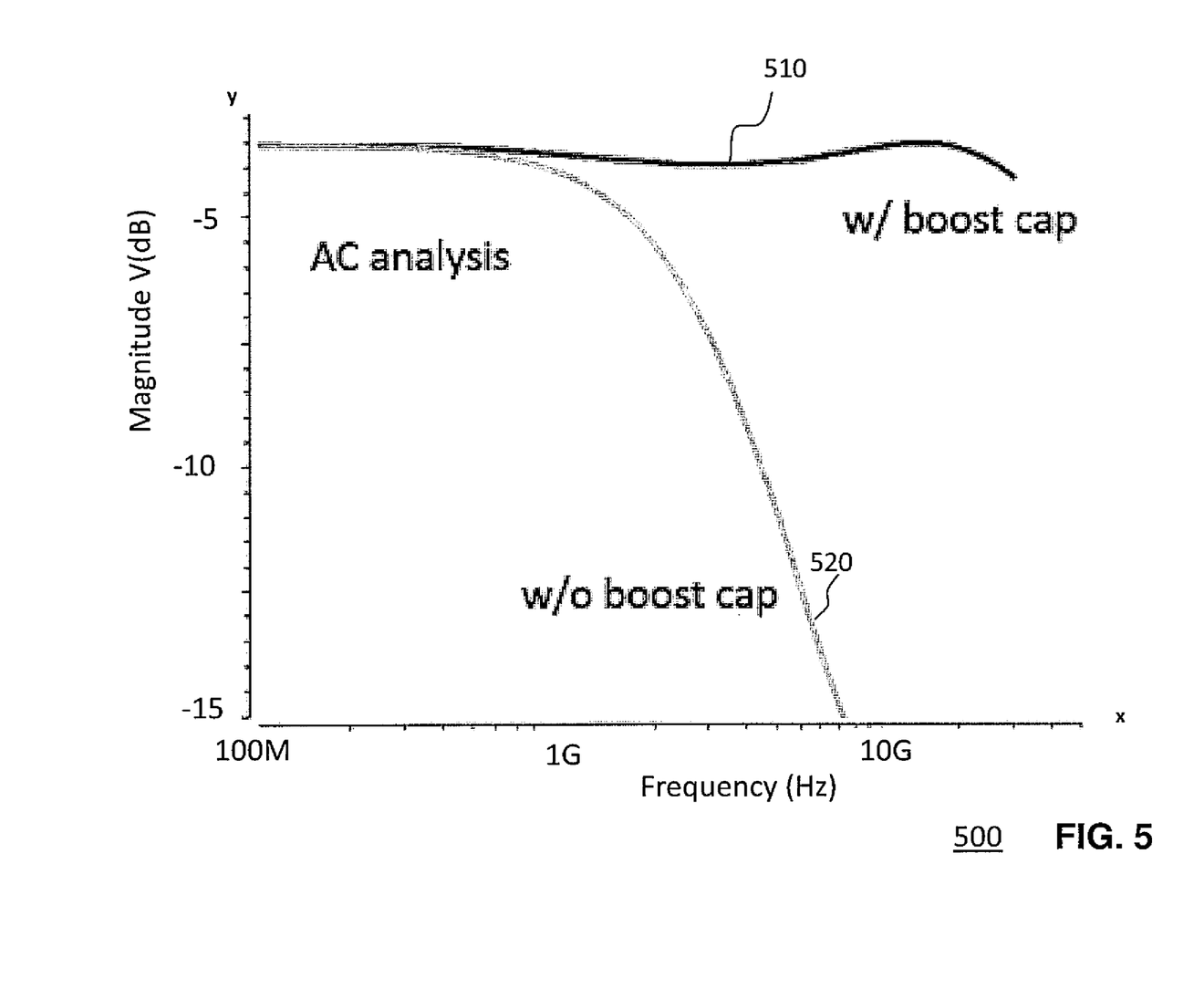
FIG. 5 illustrates the effect of an AC-boost equalization integrated into a resistive voltage divider according to an embodiment of the invention.

FIG. 5 illustrates an AC-analysis (simulation) of the AC-boost operation of the receiver circuit 10 of FIG. 3. The x-axis denotes the frequency in Hz and the y-axis the transfer function of the AC-boosted level converter 21, i.e., dB20((VINP2-VINN2)/(VINP1-VINN1)). The resistive level-converter introduces signal loss (transfer characteristic <0 dB) that is to be compensated by the successive preamplifier 30 with gain boosting.

Curve 510 shows the AC analysis of the receiver circuit 10 of FIG. 3 including the tunable boost capacitor C, while curve 520 shows the AC analysis without the tunable boost capacitor C (C=0). As can be seen in FIG. 5, the AC-boost equalization effects a bandwidth increase and peaking. Furthermore, it enables the use of high resistance values in the resistive voltage divider 21 which in turn minimizes the ODT loading. Furthermore, the AC-boost equalization accelerates the bit edge transitions due to the additional zero in the transfer characteristic.

Figure 6:
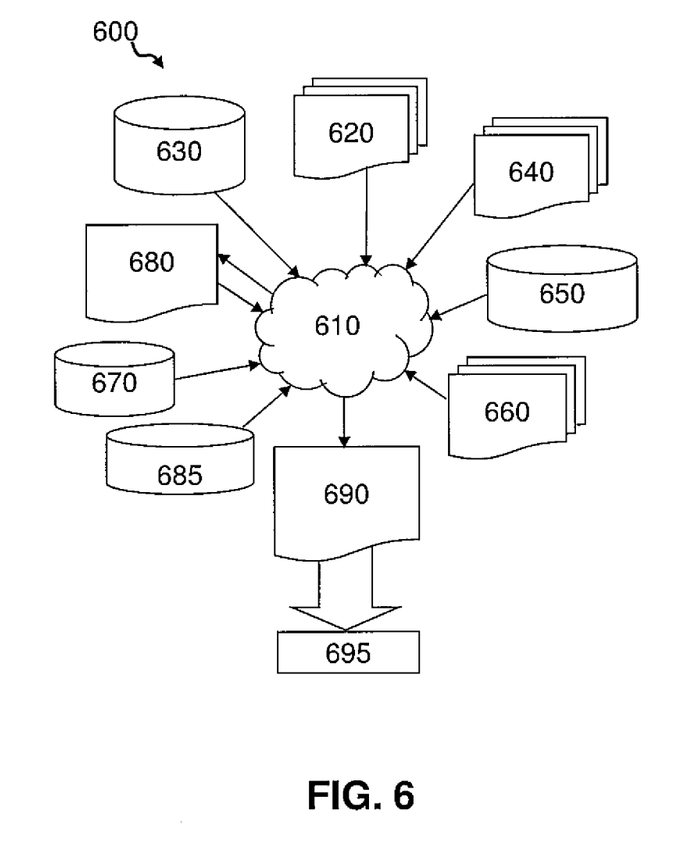
FIG. 6 shows a block diagram of an exemplary design flow used for example, in semiconductor IC logic design, simulation, test, layout, and manufacture.

FIG. 6 shows a block diagram of an exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above and shown e.g. in FIGS. 1, 2, 3, and 4. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 1, 2, and 5. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1, 2, 3, and 4 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 3, and 4. In one embodiment, design structure 690 may comprise a compiled, executable HDL simulation model that functionally simulates the devices shown in FIGS. 1, 2, 3, and 4.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 3, and 4. Design structure 690 may then proceed to a stage 695 where, for example, design structure 690: proceeds to tape-out, is released to manufacturing, is released to a mask house, is sent to another design house, is sent back to the customer, etc.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A receiver circuit configured to receive input signals having a first reference voltage level, the first reference voltage level being a first logical high voltage level, the receiver circuit comprising:
    an input stage comprising a resistive voltage divider, the resistive voltage divider being configured to convert the input signals having the first reference voltage level to input signals having a second reference voltage level, the second reference voltage level being a second logical high voltage level; and
    a preamplifier configured to receive and amplify the input signals having the second reference voltage level.

2. A receiver circuit according to claim 1, wherein the resistive voltage divider comprises
    a first resistor;
    a second resistor; and
    a tunable capacitor arranged in parallel to the first resistor, the tunable capacitor being configured to perform an alternating current (AC)-boosting.

3. A receiver circuit according to claim 2, wherein the first resistor is a tunable resistor to flexibly adapt the second reference voltage level to a plurality of first reference voltage levels.

4. A receiver circuit according to claim 1, wherein the preamplifier is a transconductance amplifier.

5. A receiver circuit according to claim 3, wherein the preamplifier is embodied as a negative gain boosting stage.

6. A receiver circuit according to claim 1, wherein the input signal is a differential input signal.

7. A receiver circuit according to claim 1, wherein the second reference voltage level is lower than the first reference voltage level.

8. A receiver circuit according to claim 1, wherein
the first reference voltage level is equal to a memory supply voltage level of a memory module;
the second reference voltage level is equal to a logic voltage level of a memory controller; and
the receiver circuit is configured to receive as input signals read-out signals of the memory module.

9. A receiver circuit according to claim 1, further comprising an analog-to-digital (A/D)-converter, wherein
the A/D converter is configured to convert analog output signals of the preamplifier into digital output signals; and
the A/D converter is operated at the second reference voltage level.

10. A memory system, comprising
a memory controller;
a memory module; and
a memory bus arranged between the memory controller and the memory module; wherein
the memory controller comprises a receiver circuit configured to receive input signals having a first reference voltage level, the first reference voltage level being a first logical high voltage level, the receiver circuit comprising
an input stage comprising a resistive voltage divider, the resistive voltage divider being configured to convert the input signals having the first reference voltage level to input signals having a second reference voltage level, the second reference voltage level being a second logical high voltage level; and
a preamplifier configured to receive and amplify the input signals having the second reference voltage level.

11. A memory system according to claim 10, wherein the resistive voltage divider comprises
a first resistor;
a second resistor; and
a tunable capacitor arranged in parallel to the first resistor, the tunable capacitor being configured to perform an alternating current (AC)-boosting.

12. A memory system according to claim 11, wherein the first resistor is a tunable resistor to flexibly adapt the second reference voltage level to a plurality of first reference voltage levels.

13. A memory system according to claim 10, wherein the memory module is a double data rate (DDR) memory module.

14. A memory system according to claim 10, wherein the memory system is configured to operate according to the JEDEC DDR-3, the JEDEC DDR-4 or a JEDEC DDR-X standard, wherein X≥5.

15. A memory system according to claim 10, wherein
the first reference voltage level is equal to the memory supply voltage level of the memory module;
the second reference voltage level is equal to a logic voltage level of the memory controller; and
the receiver circuit is configured to receive as input signals read-out signals of the memory module.

16. A memory system according to claim 10, wherein the first reference voltage level is within a range of 1.0 to 1.5 V and the second reference voltage level is in a range between 700 mV and 900 mV.

17. A design structure tangibly embodied in a machine readable medium for designing, manufacturing, or testing an integrated circuit, the design structure comprising:
a receiver circuit configured to receive input signals having a first reference voltage level, the first reference voltage level being a first logical high voltage level, the receiver circuit comprising
an input stage comprising a resistive voltage divider, the resistive voltage divider being configured to convert the input signals having the first reference voltage level to input signals having a second reference voltage level, the second reference voltage level being a second logical high voltage level; and
a preamplifier configured to receive and amplify the input signals having the second reference voltage level.

18. A design structure according to claim 17, wherein the resistive voltage divider comprises
a first resistor;
a second resistor; and
a tunable capacitor arranged in parallel to the first resistor, the tunable capacitor being configured to perform an alternating current (AC)-boosting.

19. A design structure according to claim 18, wherein the first resistor is a tunable resistor to flexibly adapt to the second reference voltage level to a plurality of first reference voltage levels.

20. A design structure according to claim 17, wherein the preamplifier is a transconductance amplifier.

21. A receiver circuit configured to receive input signals having a first reference voltage level, the first reference voltage level being a first logical high voltage level, the receiver circuit comprising:
an input stage comprising a resistive voltage divider comprising a first resistor, a second resistor, and a tunable capacitor arranged in parallel to the first resistor, the tunable capacitor being configured to perform an alternating current (AC)-boosting, the resistive voltage divider being configured to convert the input signals having the first reference voltage level to input signals having a second reference voltage level, the second reference voltage level being a second logical high voltage level; and
a preamplifier configured to receive and amplify the input signals having the second reference voltage level.

22. A memory system, comprising
a memory controller;
a memory module; and
a memory bus arranged between the memory controller and the memory module; wherein
the memory controller comprises a receiver circuit configured to receive input signals having a first reference voltage level, the first reference voltage level being a first logical high voltage level, the receiver circuit comprising
an input stage comprising a resistive voltage divider comprising a first resistor, a second resistor, and a tunable capacitor arranged in parallel to the first resistor, the tunable capacitor being configured to perform an alternating current (AC)-boosting, the resistive voltage divider being configured to convert the input signals having the first reference voltage level to input signals having a second reference voltage level, the second reference voltage level being a second logical high voltage level; and a preamplifier configured to receive and amplify the input signals having the second reference voltage level.

23. A design structure tangibly embodied in a machine readable medium for designing, manufacturing, or testing an integrated circuit, the design structure comprising:
  a receiver circuit configured to receive input signals having a first reference voltage level, the first reference voltage level being a first logical high voltage level, the receiver circuit comprising
    an input stage comprising a resistive voltage divider comprising a first resistor, a second resistor, and a tunable capacitor arranged in parallel to the first resistor, the tunable capacitor being configured to perform an alternating current (AC)-boosting, the resistive voltage divider being configured to convert the input signals having the first reference voltage level to input signals having a second reference voltage level, the second reference voltage level being a second logical high voltage level; and
    a preamplifier configured to receive and amplify the input signals having the second reference voltage level.

\* \* \* \* \*